United States Patent
Kawabata et al.

(10) Patent No.: US 7,361,933 B2
(45) Date of Patent: Apr. 22, 2008

(54) SEMICONDUCTOR DEVICE

(75) Inventors: Itaru Kawabata, Yokkaichi (JP);
Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/616,707

(22) Filed: Dec. 27, 2006

(65) Prior Publication Data

US 2007/0108474 A1    May 17, 2007

Related U.S. Application Data

(62) Division of application No. 11/092,900, filed on Mar. 30, 2005, now Pat. No. 7,176,080.

(30) Foreign Application Priority Data

Mar. 31, 2004  (JP) .............................. 2004-107153

(51) Int. Cl.
*H01L 27/108* (2006.01)
*H01L 29/04* (2006.01)
*H01L 29/76* (2006.01)
*H01L 31/036* (2006.01)
*H01L 31/112* (2006.01)

(52) U.S. Cl. ........................ 257/68; 438/238

(58) Field of Classification Search ................ 257/68, 257/71, 296, 301, 302; 438/238, 239, 386, 438/399
See application file for complete search history.

(56) References Cited

U.S. PATENT DOCUMENTS 6,744,089 B2 *  6/2004  Wu .............................. 257/301

FOREIGN PATENT DOCUMENTS

JP         2001-267528         9/2001

* cited by examiner

*Primary Examiner*—Phuc T. Dang
(74) *Attorney, Agent, or Firm*—Oblon, Spivak, McClelland, Maier & Neustadt, P.C.

(57) ABSTRACT

A semiconductor device includes a first trench capacitor formed in a first trench, a second trench capacitor formed in a second trench, a first gate electrode disposed above a first active area, a second gate electrode disposed above a second active area, a first impurity doped region formed in an outer periphery of the second trench including a boundary adjacent to the second trench and doped with an impurity of a first conduction type, and a second impurity doped region formed in the first impurity doped region so as to include the first active area located below the first gate electrode, the second impurity doped region being doped with an impurity of a second conduction type opposite to the first conduction type impurity.

11 Claims, 7 Drawing Sheets

SEMICONDUCTOR DEVICE

CROSS-REFERENCE TO RELATED APPLICATIONS

This application is a Divisional of U.S. patent application Ser. No. 11/092,900, filed Mar. 30, 2005 now U.S. Pat. No. 7,176,080, and claims priority from Japanese Patent Application No. 2004-107153, filed Mar. 31, 2004. The contents of these applications are incorporated herein by reference.

BACKGROUND OF THE INVENTION

1. Field of the Invention

The present invention relates to a method of fabricating semiconductor device provided with a plurality of unit cells each of which includes an impurity doped region and a method of fabricating the same.

2. Description of the Related Art

JP-A-2001-267528 discloses a method of manufacturing a semiconductor memory provided with trench capacitor DRAM cells, for example. In the disclosed method, a trench is filled with a polycrystalline silicon film doped with As (impurity). Thereafter, As is diffused from the polycrystalline silicon film filling the trench into the semiconductor substrate by heat treatment in the forming of a silicon oxide film to fill shallow trench isolation (STI), whereby a buried contact (strap) is formed. This can suppress an increase in resistance in a boundary between the polycrystalline silicon film and the substrate and accordingly an electrical resistance value between the polycrystalline silicon film and the substrate. Consequently, a capacitor charge/discharge speed can be prevented from being reduced, and the resultant data write/read failure can be prevented.

However, a cutoff characteristic of the cell transistor is deteriorated when the impurity is diffused thereby to reach a substrate region under a cell transistor. Accordingly, a strict adjustment is required for diffusion in the periphery of boundary from both sides of the boundary resistance and cutoff characteristic.

High integration and refinement have recently been more remarkable as compared with the prior art and accordingly, it has been desired to further densify the unit cell. As a result, the following drawback would be caused. When the unit cells are arranged in a high-density order, even an active area of a unit cell proximal to each unit cell would adversely be affected in a fabrication process of each unit cell.

In the aforesaid DRAM semiconductor storage, a distance between an active area and trench of memory cells adjacent to each other is reduced with high integration and refinement. Accordingly, when a DRAM semiconductor storage is manufactured by the aforementioned method disclosed by the foregoing Japanese patent application publication gazette, impurity diffused into an outer periphery of the trench for suppression of electrical resistance reaches an active area of an adjacent memory cell, whereupon the adjacent memory cell is adversely affected.

In particular, a region into which impurity is diffused in order to suppress electrical resistance is sometimes an active area located under a gate electrode of the adjacent cell transistor. Furthermore, part of the impurity located under the gate electrode is passivated when impurity to be diffused is of reverse conduction type relative to a channel region of the active area. As a result, the cutoff characteristic of the adjacent cell transistor is deteriorated and/or resistance to punch-through is deteriorated.

BRIEF SUMMARY OF THE INVENTION

Therefore, an object of the present invention is to provide a semiconductor device in which when the unit cells are arranged in a high-density order, an active area of a unit cell proximal to another unit cell can be prevented from being adversely affected in a fabrication process of said another unit cell, and a method of fabricating the same.

The present invention provides a semiconductor device comprising a semiconductor substrate including a first active area formed so as to extend in a first direction and having an end, a first trench formed in the end of the first active area, a second active area formed so as to be adjacent to the first active area in a second direction perpendicular to the first direction and so as to extend in the first direction, the second active area having an end, and a second trench formed in the end of the second active area so as to be adjacent to the first active area in the second direction the second trench having an outer periphery, a first trench capacitor formed in the first trench, a second trench capacitor formed in the second trench, a first gate electrode disposed above the first active area, a second gate electrode disposed above the second active area, a first impurity doped region formed in the outer periphery of the second trench including a boundary adjacent to the second trench and doped with an impurity of a first conduction type, the first impurity doped region being provided with the second gate electrode and the second trench capacitor both connected together and located in the first active area that is located below the first gate electrode adjacent to the second trench in the second direction, and a second impurity doped region provided in the first impurity doped region so as to include the first active area that is located below the first gate electrode, the second impurity doped region being doped with an impurity of a second conduction type opposite relative to the impurity of the first conduction type.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
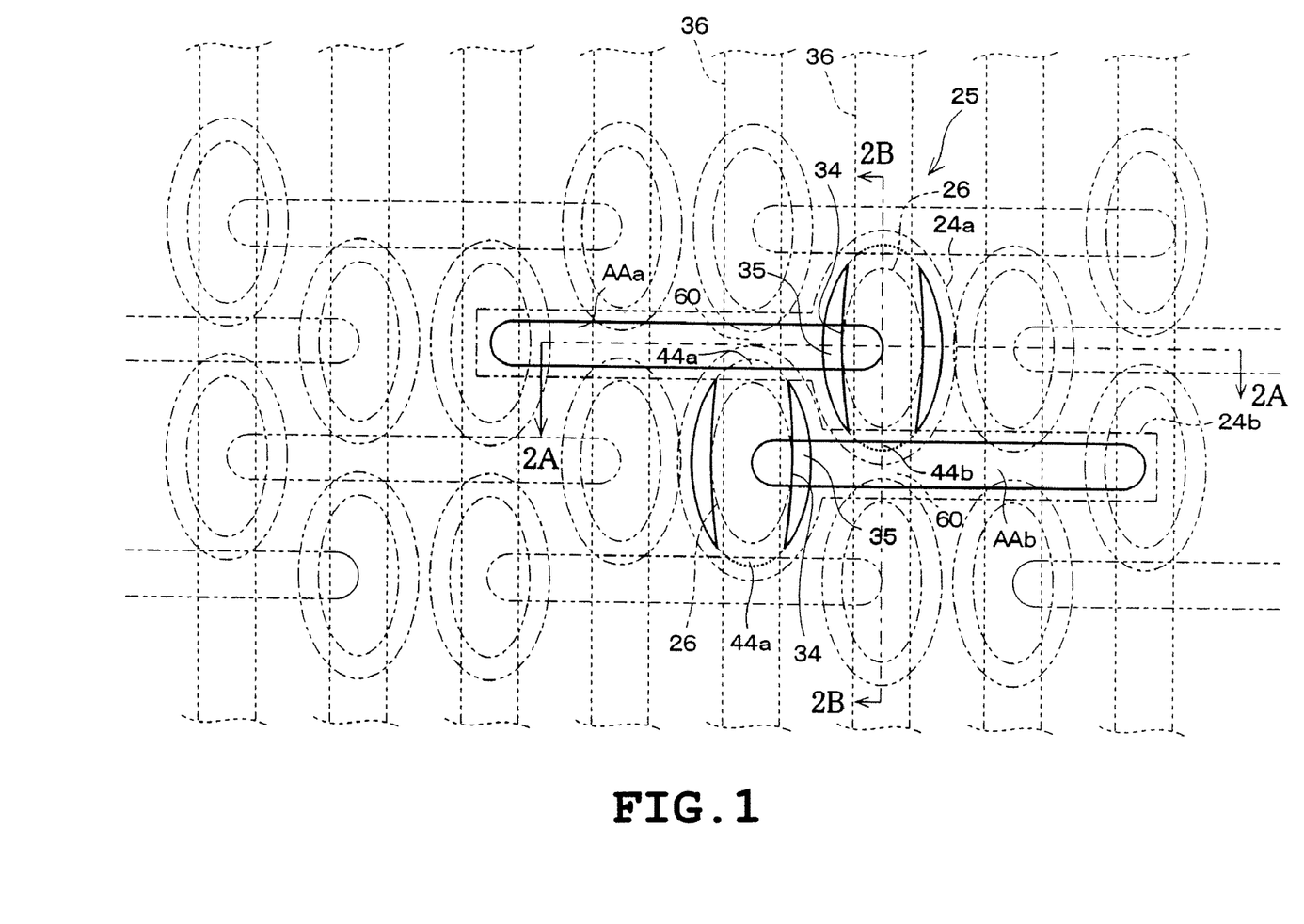
FIG. 1 is a typical plan view of a semiconductor device of one embodiment in accordance with the present invention.

One embodiment of the present invention will be described with reference to the accompanying drawings. Referring to FIG. 1, a memory cell region of a trench capacitor type DRAM semiconductor memory 21 is shown. A p-type silicon substrate 22 is employed as a semiconductor substrate in the following embodiment. However, a semiconductor substrate provided with a p-type well region may be employed as the substrate instead of the p-type silicon substrate. Additionally, a reverse conduction type substrate may be employed.

The DRAM semiconductor memory 21 provided with the trench capacitor type DRAM cells comprises a silicon semiconductor substrate 22 on which a plurality of unit memory cells 24a and 24b are arranged so as to form a memory cell region 25. Each unit memory cell 24a includes a capacitor C and a cell transistor 23. Each unit memory cell 24b adjacent to the unit memory cell 24a also includes a capacitor C and a cell transistor 23. Thus, since the components of each unit memory cell 24a have the same functions as those of each unit memory cell 24b, the components of the unit memory cells 24a and 24b are labeled by the same reference symbols.

Figure 2A:
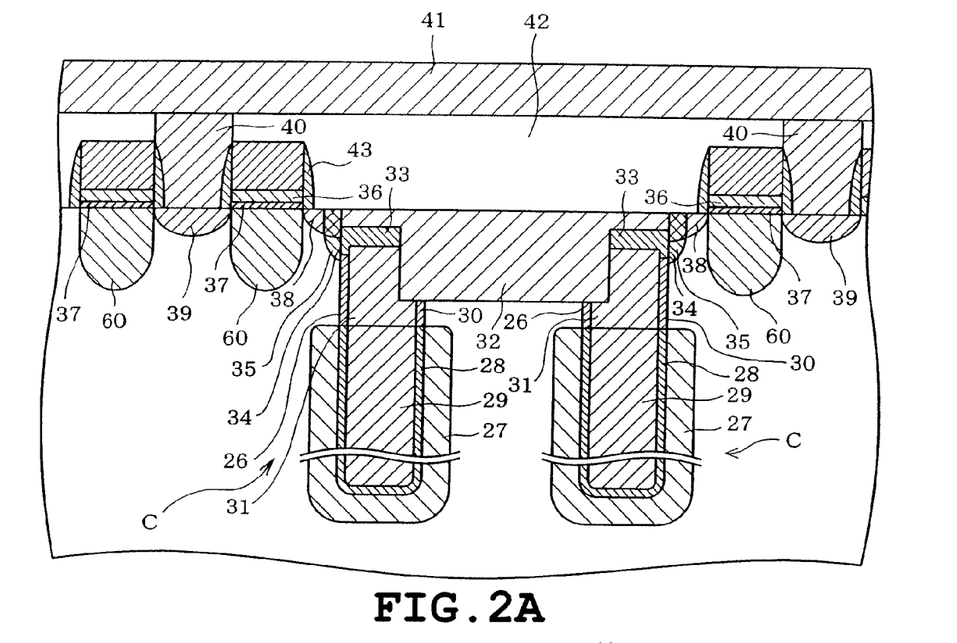
FIGS. 2A and 2B are sectional views taken along lines 2A-2A and 2B-2B in FIG. 1 respectively.
Figure 2B:
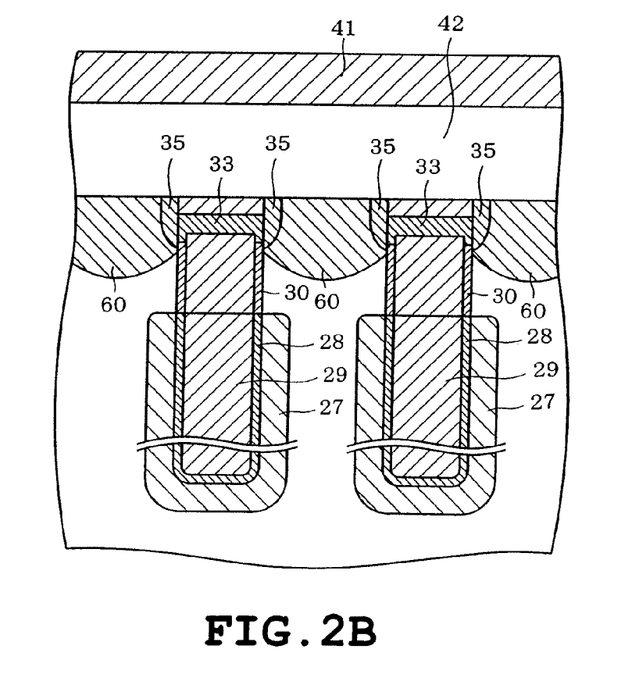

The structure of each unit memory cell 24a will now be described. Each unit memory cell 24a is formed with a deep trench 26. A capacitor C is formed in each trench 26. A plate diffusion region 27 is formed around each trench 26 so as to extend from a lower part of each trench 26 to a predetermined height. Each plate diffusion region 27 serves as one of plate electrodes of the capacitor C. A nitride oxide (NO) film 28 is formed on the plate diffusion region 27 on the inner surface of the trench 26. Each NO film 28 serves as a capacitor insulating film for separating both plate electrodes of the capacitor C. A first conductive layer 29 is formed on the NO film 28 in each trench 26. The first conductive layer 29 is made from a polycrystalline silicon or amorphous silicon doped with impurity or polycide. The first conductive layer 29 serves as the other plate electrode of each capacitor C.

A sidewall insulating film 30 is formed on inner peripheral surfaces of the sidewalls so as to be located on the first conductive layer 29 and NO film 28. The sidewall insulating film 30 serves to suppress leak current produced by a vertical parasitic transistor. A second conductive layer 31 is formed inside the sidewall insulating film 30 to serve as a storage node electrode. The second conductive layer 31 is also made from a polycrystalline silicon or amorphous silicon doped with impurity or polycide.

An element isolating film 32 made of an oxide film is provided on a part of the second conductive layer 31. The element isolating film 32 has a function of isolating itself from the other unit memory cells. The element isolating film 32 is not shown in FIG. 1. Further, a third conductive layer 33 is formed on the second conductive layer 31 and serves as a buried strap. The third conductive layer 33 is made from amorphous silicon or a polycrystalline silicon doped with donor-type impurity such as As or polycide.

Each cell transistor 23 is formed at a predetermined side of the trench 26 so as to be adjacent to and connected to the capacitor C of the trench 26. A strap 35 is anisotropically formed in an outer peripheral portion of the trench 26 including a boundary between the third conductive layer 33 and the cell transistor 23. The strap 35 serves as an impurity semiconductor region. The strap 35 is made by diffusing a donor-type impurity outward via a boundary 34 from the third conductive layer 33 so as to be located at the upper outer periphery of the trench 26. Consequently, electrical resistance can be reduced in a junction region between the third conductive layer 33 and the cell transistor 23 or between a diffusion region 38 of the cell transistor 23 and the capacitor C.

Each cell transistor 23 comprises a gate electrode 36, a gate insulating film 37 and the n-type diffusion regions 38 and 39 (source/drain diffusion layers). A bit line 41 is electrically connected via a contact plug 40 to the diffusion region 39. An interlayer dielectric film 42 is formed so as to electrically isolate the bit line 41 from the memory cells 24a and 24b. A gate sidewall insulating film 43 is formed so as to cover the gate electrode 36.

Each memory cell 24a is configured as described above. A plurality of such memory cells 24a and 24b are arranged horizontally as shown in FIG. 1. Each trench 26 has a circular transverse section. An active area AAb of each memory cell 24b is formed so as to be adjacent to the trench 26 of the memory cell 24a as shown in FIG. 1. The active area AAb is referred to as a functional region of the cell transistor 23 of the adjacent memory cell 24b, which functional region includes a channel region. The cell transistor 23 of the memory cell 24b has the same configuration as that of the memory cell 24a. The active area AAb is also indicative of a p-type electrode region of the substrate 22 under the diffusion regions 38 and 39, gate electrode 36 and gate dielectric film 37 of the memory cell 24b. FIG. 1 also schematically illustrates an active area AAa.

When the memory cells 24a and 24b are in proximity to each other as shown in FIG. 1, the trench 26 of the memory cell 24a is excessive proximity to the active area AAb of the adjacent memory cell 24b. Consequently, desired characteristics and functions cannot be achieved particularly in the p-type electrode region under the gate electrode of the active area AAb of the adjacent memory cell 25b by the influence of the strap 35 formed as the result of diffusion of donor type impurity around the upper periphery of the trench 26.

In view of the aforementioned problem, as shown in FIGS. 1 to 2B, acceptor type impurity is supplied to the p-type electrode region (channel region) under the gate electrode 36 and gate dielectric film 37 so as to compensate for the function of the active area AAb. More specifically, the donor type impurity is diffused in the region 44b where the strap 35 has diffused under the gate electrode 36 and gate dielectric film 37 of the active area AAb, as shown in FIG. 1. However, since the acceptor type impurity supplied to the region 44b is formed into a reverse conduction type impurity region 60, the function of the active area AAb is retained by the existence of the acceptor type impurity.

The acceptor type impurity is also supplied to the p-type electrode region under the gate electrode 36 and gate dielectric film 37 of the memory cell 24a so as to compensate for the function of the active area AAa. Accordingly, the function of the active area AAb is also retained by the existence of the acceptor type impurity although the donor type impurity is diffused in the region 44a.

According to the foregoing embodiment, the donor type impurity is doped in order to suppress the electrical resistance between the cell transistor 23 of the memory cell 24a and the third conductive layer 33 (capacitor C). As a result, the strap 35 is formed around the upper periphery of the trench 26. Even when the memory cells are arranged so that the strap 35 has an adverse effect on the function of the adjacent memory cell 24b, the acceptor type impurity is supplied to the p-type electrode region under the gate electrode 36 and gate dielectric film 37 of the diffused region 44b so as to compensate for the function of the active area AAb. Consequently, the function of the adjacent memory cell 24b can be retained.

A method of fabricating the foregoing memory 21 will be described with reference to FIGS. 3 to 12 which are sectional vies taken along line 2B-2B in FIG. 1 and show a sequence of steps of the fabricating method.

Figure 3:
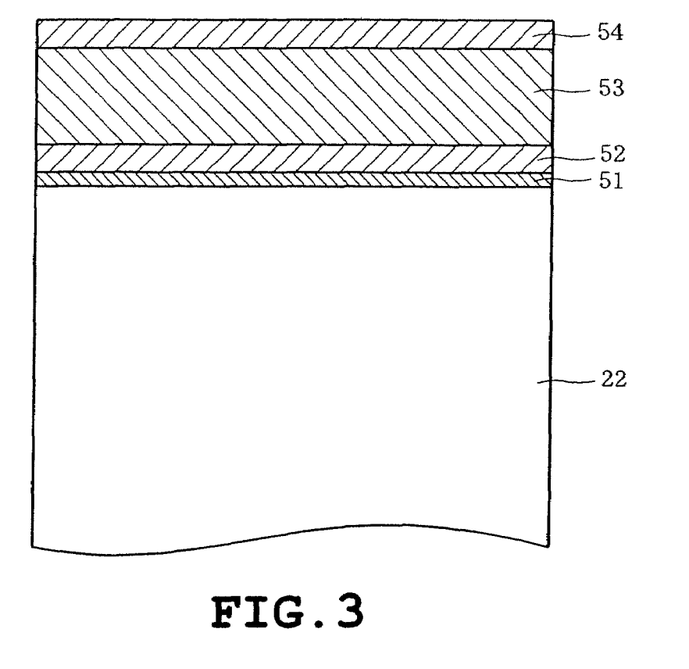
FIGS. 3 to 12 are typical longitudinal side sections of the semiconductor device, showing sequential fabrication steps (steps 1 to 10).

A silicon oxide film 51 is deposited on the silicon substrate 22, and a silicon nitride film 52 is deposited on the silicon oxide film 51, as shown in FIG. 3. A boron silicate glass (BSG) film 53 is further deposited on the silicon nitride film 52, and a tetraethyl orthosilicate (TEOS) film 54 is deposited on the BSG film 53.

Figure 4:
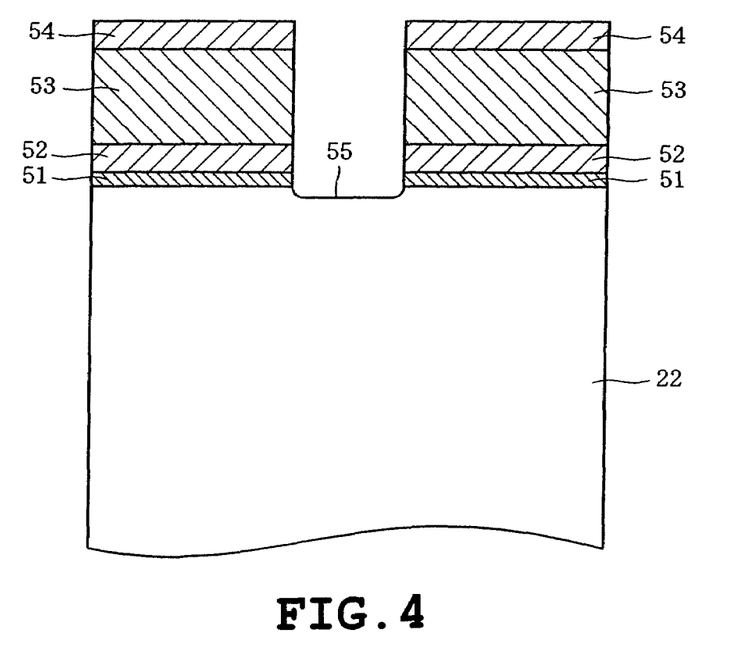
Figure 5:
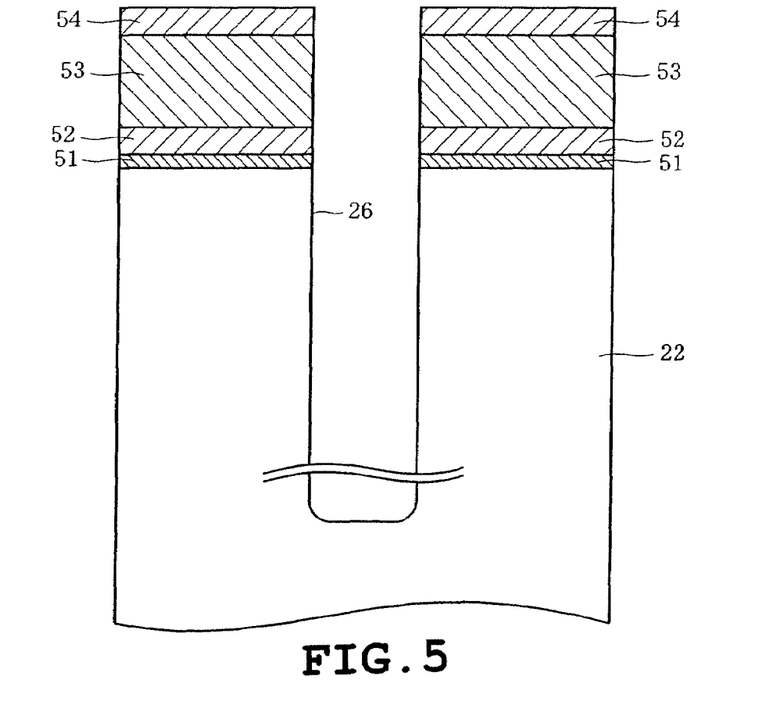

Subsequently, a photoresist (not shown) is patterned in order that a deep trench is formed in the TEOS film 54 as shown in FIG. 4. Anisotropic etching is carried out for the silicon oxide film 51, silicon nitride film 52, BSG film 53 and TEOS film 54. The resist pattern is then removed and subsequently, the substrate 22 is etched by anisotropic etching with the BSG and TEOS films 53 and 54 serving as a mask so that a predetermined depth is reached, as shown in FIG. 5. Subsequently, the BSG and TEOS films 53 and 54 are removed.

Figure 6:
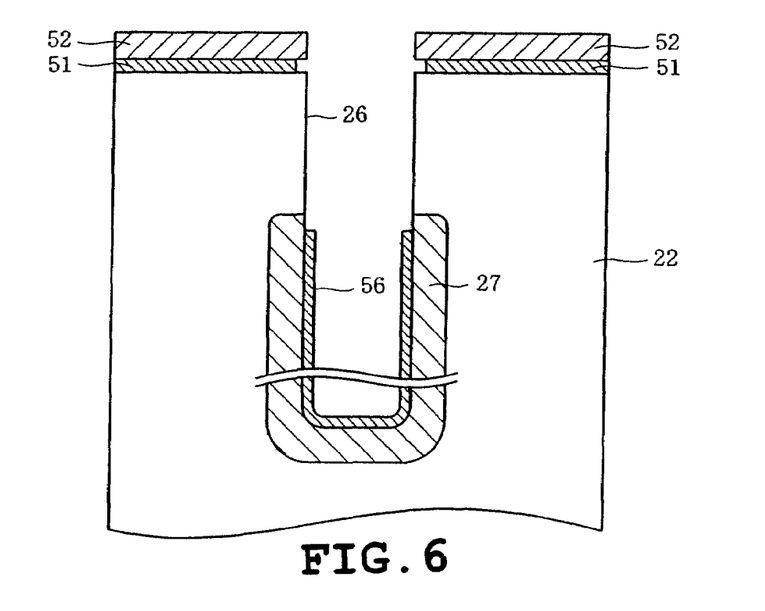
Figure 7:
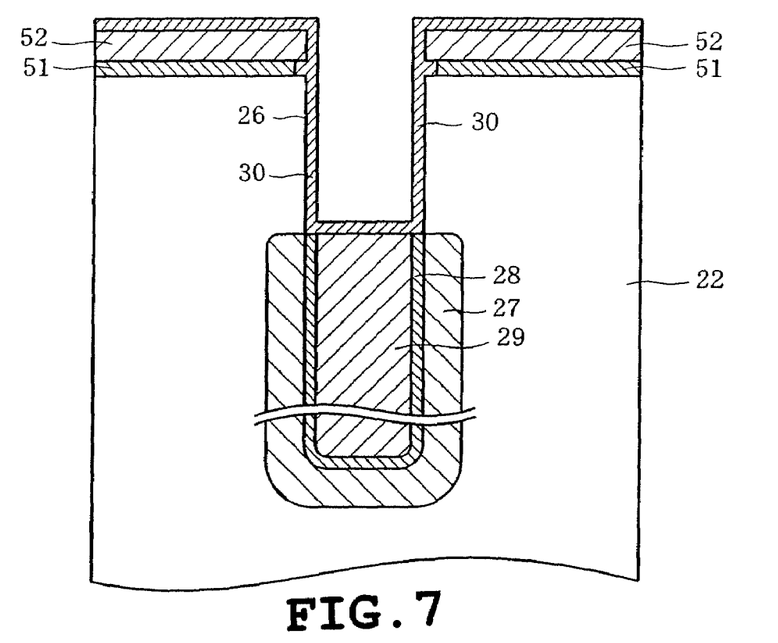

Furthermore, silica glass 56 is deposited on the inner surface of the trench 26 so as to extend from the bottom of the trench to a predetermined depth as shown in FIG. 6. The silica glass 56 is covered by the TEOS film (not shown) and then heat-treated at high temperatures so that a plate diffusion region 27 of the capacitor C is formed on the outer peripheral surface of the trench 26. The TEOS film and silica glass 56 both in the trench 26 are removed and the remainder is washed. Thereafter, part of the substrate 22 forming the inner surface of trench 26 is nitrided thinly such that the silicon nitride film is formed as shown in FIG. 7. The surface of the silicon nitride film is oxidized to be formed into the NO film 28.

The first conductive layer 29 made from a polycrystalline silicon doped with As is formed on the inside of the NO film 28. The first conductive layer 29 and the plate diffusion region 27 serve as both plate electrodes. Subsequently, the first conductive layer 29 and the NO film 28 are etched down to the top surface of the plate diffusion region 27. The insulating film 30 is then formed on the top surface of the plate diffusion region 27 isotropically relative to the inner surface of the trench 26. The insulating film 30 is formed by depositing the TEOS material.

Figure 8:
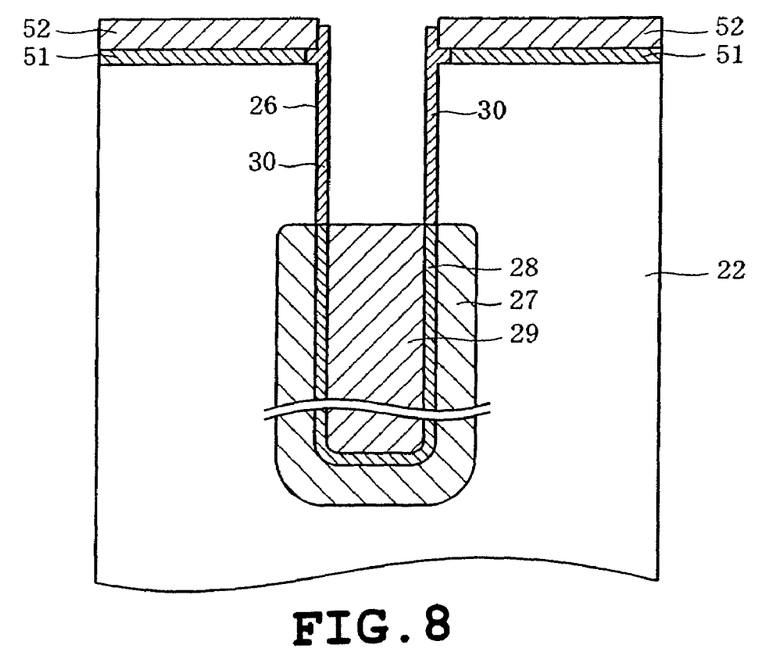

The insulating film 30 formed on the first conductive layer 29 is removed by anisotropic etching as shown in FIG. 8. Accordingly, the insulating film 30 remains on the inner wall surface of the trench 26. The remaining film is formed into the sidewall insulating film 30.

Figure 9:
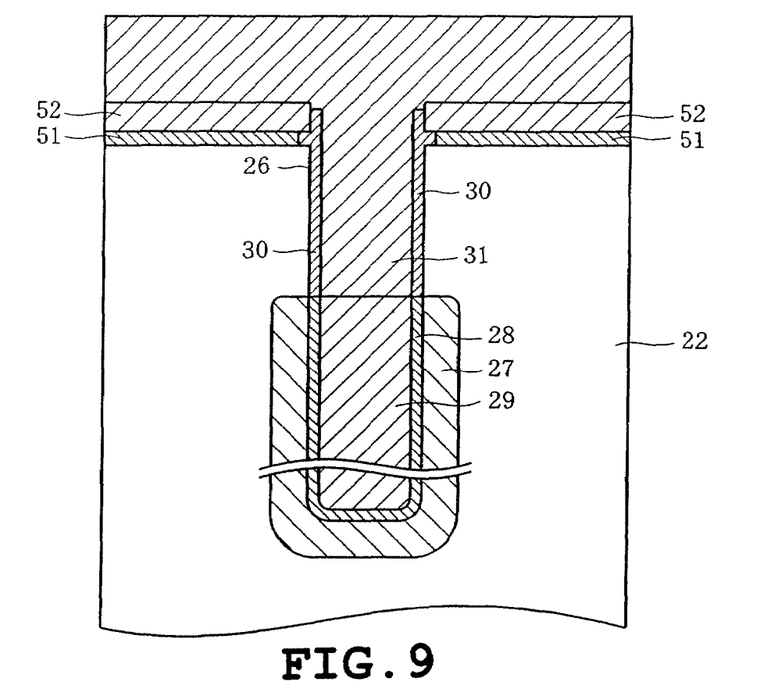
Figure 10:
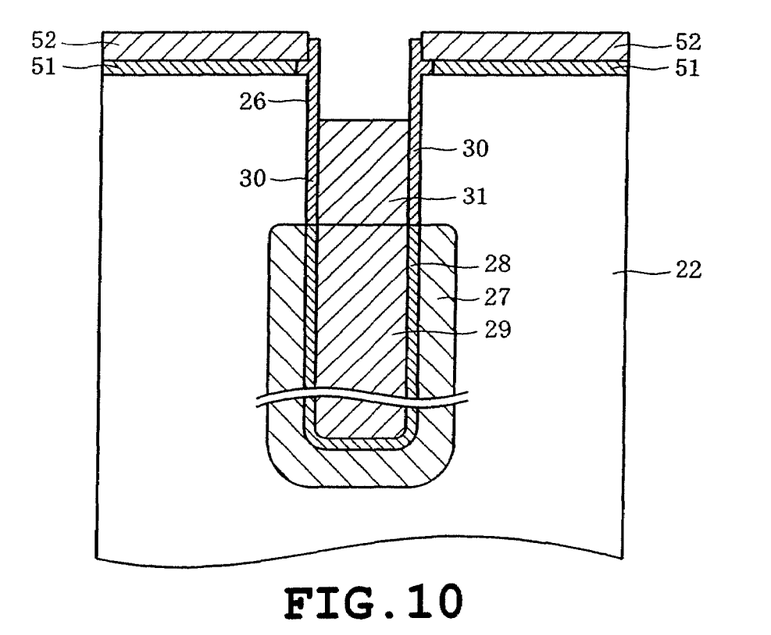

A second conductive layer 31 is formed on the first conductive layer 29 from which the insulating film 30 has been removed, as shown in FIG. 9. The second conductive layer 31 is made from a polycrystalline silicon doped with impurity, for example. The first and second conductive layers 29 and 31 may be made from amorphous silicon doped with impurity or polycide, instead. Subsequently, the second conductive layer 31 is etched down to a position located slightly deeper than the upper surface of the substrate 22, as shown in FIG. 10.

Figure 11:
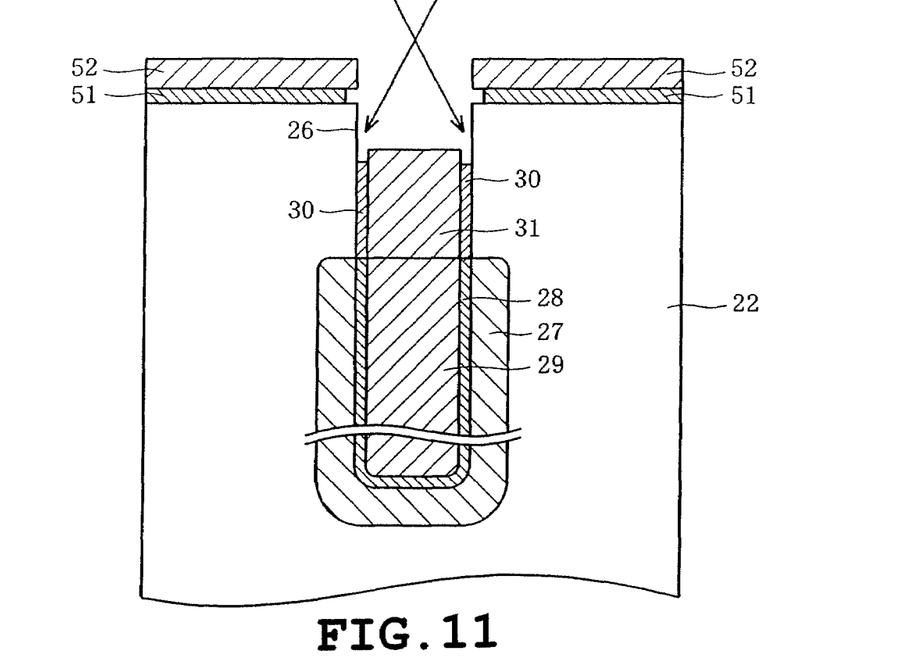

The insulating film 30 located at the upper exposed side formed with the second conductive layer 31 is selectively removed by isotropic etching as shown in FIG. 11. Acceptor-type impurity is implanted aslant from over the trench 26. In other words, ion is implanted from the central side of the trench 26 substantially in parallel to the flat face of the boundary 34 so that ion is prevented from being implanted to the boundary as shown in FIG. 1. In further other words, ion is implanted in the direction which is perpendicular to the channel of the cell transistor of the adjacent memory cell 24b and is slightly slant relative to the substrate 22. Acceptor-type impurity such as B+, BF$_2$+ or the like is desirable as a material for implanted ion.

Furthermore, no acceptor-type impurity is implanted to the strap 35 of the active area AAa formed at a predetermined side of the trench 26 in order that the function compensating impurity is supplied to the active area AAb of the memory cell 24b aslant relative to the upper surface of the substrate 22 as shown in FIG. 1. The reason for this is that the direction of supply or implantation becomes parallel to the strap 35. More specifically, since a region where the acceptor-type impurity is implanted (impurity implantation region) is adjusted mainly to the region (region 44b) under the gate of the adjacent memory cell region 24b (see a reverse conduction type impurity region 60 in FIGS. 1, 2A and 2B), no impurity is implanted to a PN junction region of the strap 35 in the adjacent memory cell region 24b. Consequently, the resistance value of the strap 35 can be suppressed. Furthermore, leak current from the junction can be prevented from being increased with increase in the density of acceptor impurity in the boundary 34a, and the charge retaining characteristic of the capacitor C can be prevented from being reduced with the increase in the aforesaid leak current.

Figure 12:
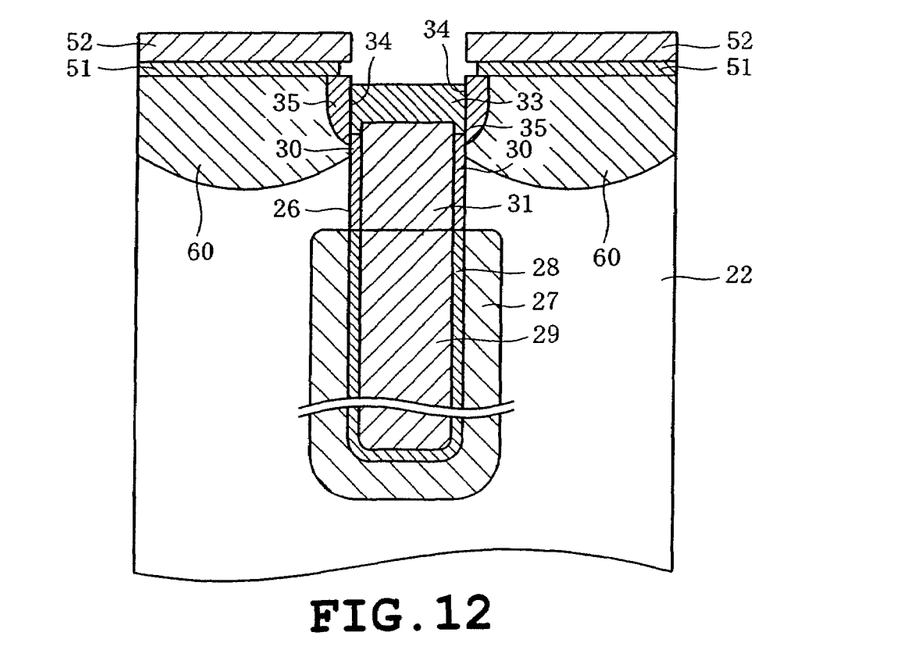

The third conductive layer 33 comprising the polycrystalline silicon doped with donor-type impurity is formed on the second conductive layer 31 and sidewall insulating film 30, as shown in FIG. 12. The third conductive layer 33 is etched back near to the top surface of the substrate 22. In this case, the impurity is diffused via the boundary 34 between the third conductive layer 33 and the substrate 22, whereby the strap 35 is formed.

The third conductive layer 33 is connected via the boundary 34 and strap 35 to the source/drain diffusion layer 38. The strap 35 may be formed by implanting donor-type impurity into the upper outer periphery of the trench 26 including the boundary 34, instead. The strap 35 serves to suppress the electrical resistance between the source/drain diffusion layer 38 of the cell transistor 23 and the capacitor C. In this case, when the trench 26 of the memory cell region is in proximity to the gate electrode of the adjacent active area AAb, the donor-type impurity diffused to the upper outer periphery of the trench 26 in the memory cell region reaches the p-type electrode region under the gate electrode 36 of the adjacent active area AAb and gate dielectric film 37. However, since the acceptor-type impurity has been supplied to the p-type electrode region under the gate electrode 36, the region under the gate can be prevented from being passivated. Consequently, the gate of the cell transistor 23 of the adjacent memory cell 24b can be prevented from being reduced, and reductions in the cutoff and punch-through characteristics can be suppressed.

Subsequently, the element isolating film 32 is formed on the side of the trench 26. The cell transistor 23 is formed so as to be electrically conductive to the source/drain diffusion layer 38 or the third conductive layer 33. The gate electrode 36 and gate dielectric film 37 are formed with the cell transistor 23. The interlayer dielectric film 42 and bit line 41 are then formed. Thus, the memory cell 24a provided with the cell transistors 23 and capacitors C can be configured, and the DRAM semiconductor storage 21 can be fabricated.

According to the foregoing fabrication method, the acceptor-type impurity is implanted to the p-type electrode region under the gate of the memory cell 24b from the trench 26 constituting the memory cell 24a aslant relative to the top surface of the substrate 22. Accordingly, reductions in the cutoff and punch-through characteristics of the cell transistors in the adjacent active area AAb can be suppressed even when the donor-type impurity such as phosphor or arsenic is supplied from the upper part of the trench 26 of the memory cell 24a to the upper periphery of the trench 26 including the boundary 34.

The acceptor-type impurity is selected as the impurity to be implanted. Consequently, the p-type electrode region under the gate electrode 36 and gate dielectric film 37 can be prevented from being passivated, and accordingly, the cutoff characteristic of the cell transistor 23 of the memory cell 24b can be improved.

Furthermore, the aforementioned effects can be achieved when a step of implanting the acceptor-type impurity is just added to the normal fabricating process.

A second embodiment of the invention will now be described. Since the second embodiment differs from the first embodiment in the fabricating process, only the difference in the fabricating process will be described.

In the first embodiment, the acceptor-type impurity is implanted to the active area AAb of the adjacent memory cell region 24b after the first and second conductive layers 29 and 31 and sidewall insulating film 30 have been formed. Subsequently, the third conductive layer 33 is formed in the trench 26, and the resistance-suppressing donor-type impurity is diffused to the upper periphery of the trench 26 so that the strap 35 is formed.

However, the second embodiment provides the following fabricating process, instead. After the forming of the first conductive layer 29, the insulating film 30 is formed on the sidewalls of the trench 26 over the first conductive layer 29 and the NO film 28. The second conductive layer 31 is formed inside the insulating film 30. A part of the insulating film 30 located at the upper exposed side formed with the second conductive layer 31 is removed thereby to be formed into the sidewall insulating film 30. The third conductive layer 33 is formed on the second conductive layer 31 and sidewall insulating film 30. The acceptor type impurity is implanted to the active area AAb of the adjacent memory cell 24b thereby to be formed into the reverse conduction type impurity region 60. In this case, when heat treatment is executed before or after the ion implantation, the electrical resistance suppressing donor-type impurity is diffused to the upper outer periphery of the trench 26 such that the strap 35 is formed. Since the subsequent fabrication steps are substantially the same as those in the first embodiment, the description of these steps will be eliminated. In this method, too, the function of the memory cell 24b is compensated.

According to the second embodiment, the reverse conduction type impurity region 60 is formed by the ion implantation from above the third conductive layer 33 after the forming of the third layer in the trench 26. Consequently, the second embodiment can achieve substantially the same effect as the first embodiment.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
a semiconductor substrate including a first active area formed so as to extend in a first direction and having an end, a first trench formed in the end of the first active area, a second active area formed so as to be adjacent to the first active area in a second direction perpendicular to the first direction and so as to extend in the first direction, the second active area having an end, and a second trench formed in the end of the second active area so as to be adjacent to the first active area in the second direction, the second trench having an outer periphery;
a first trench capacitor formed in the first trench;
a second trench capacitor formed in the second trench;
a first gate electrode disposed above the first active area;
a second gate electrode disposed above the second active area;
a first impurity doped region formed in the outer periphery of the second trench including a boundary adjacent to the second trench and doped with an impurity of a first conduction type, the first impurity doped region being provided with the second gate electrode and the second trench capacitor both connected together and located in the first active area that is located below the first gate electrode adjacent to the second trench in the second direction; and
a second impurity doped region provided in the first impurity doped region so as to include the first active area that is located below the first gate electrode, the second impurity doped region being doped with an impurity of a second conduction type opposite relative to the impurity of the first conduction type.

2. A semiconductor device comprising:
a semiconductor substrate including a first cell transistor having a first active area formed so as to extend in a first direction and having an end, a first trench formed in the end of the first active area, a second cell transistor having a second active area adjacent to the first active area in a second direction perpendicular to the first direction and formed so as to extend in the first direction, the second active area having an end, and a second trench formed in the end of the second active area so as to be adjacent to the first active area in the second direction;
a first trench capacitor formed in the first trench;
a second trench capacitor formed in the second trench and having a sidewall;
a first gate electrode disposed above the first active area;
a second gate electrode disposed above the second active area;
a first conductive region formed in the second trench so as to serve as an electrode of the second trench capacitor;
a sidewall insulating film formed on the sidewall of the second trench and on the first conductive region;
a second conductive region formed inside the sidewall insulating film;
a third conductive region formed over the sidewall insulating film and the second conductive region so as to be connected to the second cell transistor;
a first impurity doped region including a boundary connecting the second cell transistor and the third conductive region and on an outer periphery of the trench so as to be located in the first active area located below the first gate electrode adjacent to the second trench in the second direction, the first impurity doped region being doped with an impurity of a first conduction type; and
a second impurity doped region provided in the first impurity doped region so as to include the first active area located below the first gate electrode, the second impurity doped region being doped with an impurity of a second conduction type opposite to the impurity of the first conduction type.

3. The device according to claim 1, wherein each of the first and second trenches includes a transverse section formed into a shape of an ellipse, and the ellipse has a longer axis extending in the second direction.

4. The device according to claim 2, wherein each of the first and second trenches includes a transverse section formed into a shape of an ellipse, and the ellipse has a longer axis extending in the second direction.

5. The device according to claim 2, wherein the first conductive region includes a polycrystalline silicon layer or an amorphous silicon layer.

6. The device according to claim 2, wherein the second conductive region includes a polycrystalline silicon layer or an amorphous silicon layer.

7. The device according to claim 2, wherein the third conductive region includes a polycrystalline silicon layer or an amorphous silicon layer.

8. The device according to claim 1, wherein the first trench capacitor includes a first capacitor insulating film comprised of a silicon nitride film formed along an inner surface of the first trench, and the second trench capacitor includes a second capacitor insulating film comprised of a silicon nitride film formed along an inner surface of the second trench.

9. The device according to claim 2, wherein the first trench capacitor includes a first capacitor insulating film comprised of a silicon nitride film formed along an inner surface of the first trench, and the second trench capacitor includes a second capacitor insulating film comprised of a silicon nitride film formed along an inner surface of the second trench.

10. The device according to claim 1, wherein the impurity of the first conduction type is a donor type impurity and the impurity of the second conduction type is an accepter type impurity.

11. The device according to claim 2, wherein the impurity of the first conduction type is a donor type impurity and the impurity of the second conduction type is an accepter type impurity.

* * * * *